(12) United States Patent
Aoike et al.

(10) Patent No.: US 10,163,749 B2
(45) Date of Patent: Dec. 25, 2018

(54) SEMICONDUCTOR DEVICE AND METHOD OF MANUFACTURING THE SAME

(71) Applicant: Murata Manufacturing Co., Ltd., Kyoto (JP)

(72) Inventors: Masayuki Aoike, Kyoto (JP); Atsushi Kurokawa, Kyoto (JP); Atsushi Kobayashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/784,709

(22) Filed: Oct. 16, 2017

(65) Prior Publication Data

US 2018/0108588 A1 Apr. 19, 2018

(30) Foreign Application Priority Data

Oct. 19, 2016 (JP) .................................. 2016-205225

(51) Int. Cl.
*H01L 23/31* (2006.01)
*H01L 21/02* (2006.01)

(52) U.S. Cl.
CPC ...... *H01L 23/3171* (2013.01); *H01L 21/0214* (2013.01); *H01L 21/0217* (2013.01); *H01L 21/02164* (2013.01); *H01L 21/02274* (2013.01)

(58) Field of Classification Search
CPC ................. H01L 29/93; H01L 27/0229; H01L 27/10823; H01L 21/82; H01L 23/3171
See application file for complete search history.

(56) References Cited

U.S. PATENT DOCUMENTS 8,502,286 B2 * 8/2013 Lim ................ H01L 21/823807
257/288
8,941,218 B1 1/2015 Perkins
2011/0018044 A1 1/2011 Lim et al.

* cited by examiner

*Primary Examiner* — Quoc Hoang
(74) *Attorney, Agent, or Firm* — Pearne & Gordon LLP (57) ABSTRACT

A semiconductor device includes a semiconductor substrate, a semiconductor element formed in or on the semiconductor substrate, a metal layer connected to the semiconductor element, and a passivation film that protects the semiconductor element. The passivation film is formed by alternately stacking a first insulation film that has larger tensile stress and a second insulation film that has smaller tensile stress. Each of the first insulation film and the second insulation film is one of a silicon nitride film, a silicon oxide film, and a silicon oxynitride film. The passivation film as a whole generates tensile stress.

6 Claims, 13 Drawing Sheets

SEMICONDUCTOR DEVICE AND METHOD OF MANUFACTURING THE SAME

This application claims priority from Japanese Patent Application No. 2016-205225 filed on Oct. 19, 2016. The content of this application is incorporated herein by reference in its entirety.

BACKGROUND OF THE DISCLOSURE

1. Field of the Disclosure

The present disclosure relates to a semiconductor device in which a passivation film is formed on or over a semiconductor substrate and a method of manufacturing the semiconductor device.

2. Description of the Related Art

Semiconductor devices including a semiconductor substrate, a semiconductor element formed in or on the semiconductor substrate, and a passivation film that protects the semiconductor element are generally known (see, for example, U.S. Pat. No. 8,941,218). U.S. Pat. No. 8,941,218 describes a structure in which a passivation film is formed by alternately stacking compressive stress films and tensile stress films and the passivation film as a whole generates compressive stress.

A passivation film is a protective film formed on or over a surface of a device, and the passivation film is formed in the final step of a wafer process. Therefore, on a wafer surface on which a passivation film is to be formed, for example, a semiconductor layer, an insulation layer, an organic layer, and a metal layer have been formed. That is, the wafer surface has the process history accumulated before the passivation film is formed. The wafer tends to have residual compressive stress due to the differences in the thermal expansion coefficient between various materials.

The passivation film described in U.S. Pat. No. 8,941,218 as a whole generates compressive stress. When such a passivation film is formed on a wafer surface, the compressive stress of the passivation film is added to the residual compressive stress of the wafer. As a result, a problem arises in that the wafer may warp and the passivation film may crack due to these compressive stresses.

BRIEF SUMMARY OF THE DISCLOSURE

An object of the present disclosure, which has been devised to solve the problem of existing technology, is to provide a semiconductor device that can reduce the warping of a wafer and forming of a crack in a passivation film and a method of manufacturing the semiconductor device.

According to preferred embodiments of the present disclosure, a semiconductor device includes a semiconductor substrate, a semiconductor element formed in or on the semiconductor substrate, and a passivation film that protects the semiconductor element. The passivation film is formed by alternately stacking a first insulation film that has larger tensile stress and a second insulation film that has small tensile stress, and the passivation film as a whole generates tensile stress.

With the structure described above, even when compressive stress due to the process history is generated in the semiconductor substrate, the passivation film generating tensile stress can alleviate the compressive stress of the semiconductor substrate. As a result, the warping of a wafer including the semiconductor substrate and the generation of a crack in the passivation film can be reduced.

In the semiconductor device, the second insulation film may generate compressive stress.

In this case, the tensile stress of the second insulation film is smaller than the tensile stress of the first insulation film. By appropriately adjusting the stress tendency, the thickness, and the like of each of the first insulation film and the second insulation film, the passivation film as a whole can generate tensile stress.

In the semiconductor device, each of the first insulation film and the second insulation film may be one of a silicon nitride film, a silicon oxide film, and a silicon oxynitride film.

In this case, since the passivation film is formed by stacking the first insulation film and the second insulation film, the passivation film can have insulating property and moisture resistance.

In the semiconductor device, a semiconductor layer, an insulation layer, an organic layer, and a metal layer may be formed on or over the semiconductor substrate; and the passivation film may be formed on or over the semiconductor substrate so as to cover the semiconductor layer, the insulation layer, the organic layer, and the metal layer.

In this case, even when the semiconductor layer, the insulation layer, the organic layer, and the metal layer generate compressive stresses due to the differences in the thermal expansion coefficient therebetween, the passivation film generating tensile stress can alleviate these compressive stresses.

According preferred embodiment of the present disclosure, a method of manufacturing a semiconductor device includes a step of forming a passivation film on or over a semiconductor substrate by alternately stacking a first insulation film that has larger tensile stress and a second insulation film that has small tensile stress so that the passivation film as a whole generates tensile stress.

With the method described above, even when compressive stress due to the process history is generated in the semiconductor substrate, the passivation film generating tensile stress can alleviate the compressive stress of the semiconductor substrate. As a result, the warping of a wafer including the semiconductor substrate and generation of a crack in the passivation film can be reduced.

The method may further include a step of forming a semiconductor layer, an insulation layer, an organic layer, and a metal layer on or over the semiconductor substrate, the step being performed before the step of forming the passivation film; and, in the step of forming the passivation film, the passivation film may be formed on or over the semiconductor substrate so as to cover the semiconductor layer, the insulation layer, the organic layer, and the metal layer.

In this case, even when the semiconductor layer, the insulation layer, the organic layer, and the metal layer generate compressive stresses due to the differences in the thermal expansion coefficient therebetween, the passivation film generating tensile stress can alleviate these compressive stresses.

In the method, the metal layer may be formed by vapor deposition or plating.

In this case, even when compressive stress is generated in the metal layer while the metal layer is being formed, the passivation film generating tensile stress can alleviate the compressive stress of the metal layer.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, semiconductor devices according to embodiments of the present disclosure will be described with reference to the drawings. Each of the semiconductor devices can be used, for example, as an electric power amplifier that amplifies a high-frequency signal having a frequency in, for example, a megahertz band or a gigahertz band.

Figure 1:
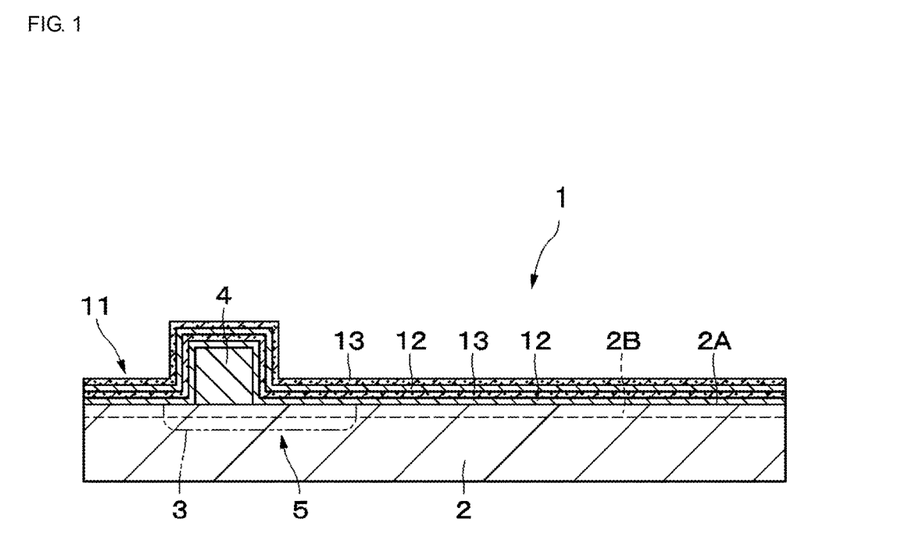
FIG. 1 is a sectional view of a semiconductor device according to a first embodiment.

FIG. 1 illustrates a semiconductor device 1 according to a first embodiment. The semiconductor device 1 includes a semiconductor substrate 2, a metal layer 4, and a passivation film 11.

The semiconductor substrate 2 is a planar substrate made of a semiconductor material, such as gallium arsenide (GaAs). The semiconductor substrate 2 may be made of another group III-V compound semiconductor, such as indium phosphide (InP) or gallium nitride (GaN). The semiconductor substrate 2 may be made of a group II-VI compound semiconductor, such as zinc selenide (ZnSe), or a group IV compound semiconductor, such as silicon carbide (SiC) or silicon germanium (SiGe). Instead of a compound semiconductor, the semiconductor substrate 2 may be made of a group IV single element semiconductor, such as silicon (Si) or germanium (Ge).

A semiconductor layer 2B, which is made of gallium arsenide (GaAs), aluminium gallium arsenide (AlGaAs), or the like, is formed on a surface 2A of the semiconductor substrate 2. The semiconductor layer 2B may or may not be doped with impurities. The semiconductor layer 2B may consist of one layer or a plurality of layers (for example, two layers).

A semiconductor element 3 is disposed in or on the semiconductor substrate 2 at a position near the surface 2A. For example, the semiconductor element 3 is formed so as to include a part of the semiconductor layer 2B. The semiconductor element 3 may be an active element, such as a diode or a field-effect transistor, or a passive element, such as a resistor or a capacitor. In general, a plurality of semiconductor elements 3 are disposed in or on the semiconductor substrate 2 (although only one of them is shown in the figures). The plurality of semiconductor elements 3 are electrically connected to each other through the metal layer 4.

The metal layer 4 is formed on the surface 2A of the semiconductor substrate 2. The metal layer 4 is made of an electrically conductive metal material, such as gold (Au). The metal layer 4 has various functions, such as a function of forming electrodes of the semiconductor element 3, a function of electrically connecting a plurality of semiconductor elements 3 to each other, and a function of electrically connecting the semiconductor element 3 to the outside. As a result, a circuit 5 (such as an amplifier circuit) including the semiconductor elements 3 is formed in or on the semiconductor substrate 2. Therefore, the semiconductor substrate 2 is a circuit substrate in which the circuit 5 is formed.

Figure 2:
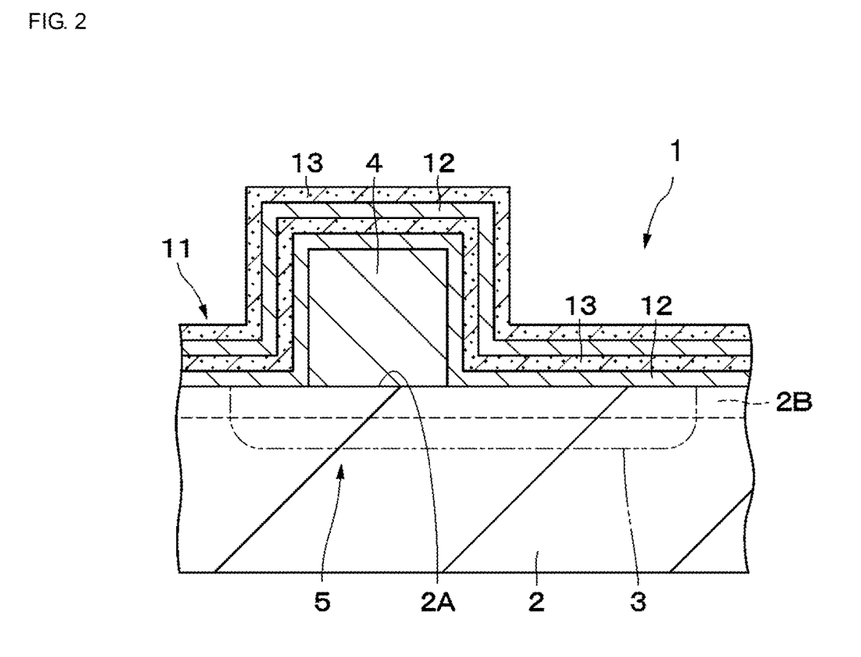
FIG. 2 is a partial enlarged sectional view of the semiconductor device according to the first embodiment.
Figure 3:
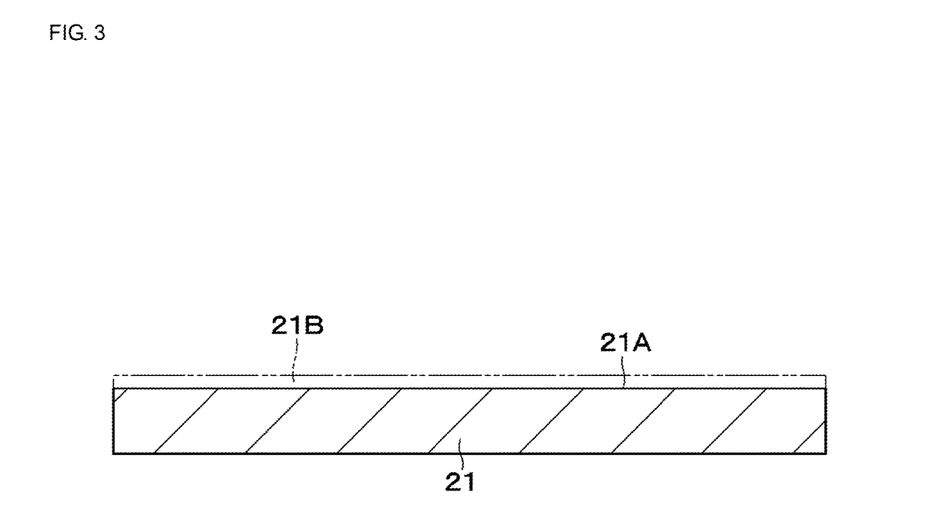
FIG. 3 is a sectional view illustrating a semiconductor layer forming step.

The passivation film 11 is disposed on or over the surface 2A of the semiconductor substrate 2 so as to cover the metal layer 4. Therefore, the passivation film 11 covers not only the metal layer 4 but also the semiconductor layer 2B. The passivation film 11 is formed by alternately stacking a first insulation film 12 that has larger tensile stress and a second insulation film 13 that has smaller tensile stress; and the passivation film 11 as a whole generates tensile stress.

Each of the first insulation film 12 and the second insulation film 13 is, for example, a silicon nitride film. The first insulation film 12 and the second insulation film 13 are made by using a film forming method, such as plasma vapor deposition (plasma CVD). The first insulation film 12 and the second insulation film 13 are formed under different film forming conditions (growth conditions). For example, the first insulation film 12 and the second insulation film 13 are formed by supplying different amounts of high frequency electric power (RF power) to a discharge electrode of a plasma CVD device. To be specific, the second insulation film 13 is formed by using a larger amount of high frequency electric power than the first insulation film 12. Thus, the second insulation film 13 is a silicon nitride film that has a higher density than the first insulation film 12. As a result, the second insulation film 13 is more resistant to moisture than the first insulation film 12.

In addition, since the second insulation film 13 is a silicon nitride film having a higher density than the first insulation film 12, the second insulation film 13 tends to generate compressive stress. Therefore, the tensile stress of the second insulation film 13 is smaller than the tensile stress of the first insulation film 12.

The film forming conditions and the like are appropriately set so that the second insulation film 13 generates compressive stress. Therefore, the second insulation film 13 is a compressive stress film, which generates compressive stress. On the other hand, the film forming conditions and the like are appropriately set so that the first insulation film 12 generates tensile stress. Therefore, the first insulation film 12 is a tensile stress film, which generates tensile stress.

The passivation film 11 is formed by alternately stacking the first insulation film 12 and the second insulation film 13. The passivation film 11 may consist of two insulation films, which are one first insulation film 12 and one second insulation film 13 that are stacked, or three or more insulation films. That is, the number of first insulation films 12 and the number of second insulation films 13 may be the same as or different from each other. FIG. 1 illustrates an example in which the passivation film 11 includes two first insulation films 12 and two second insulation films 13.

The passivation film 11 is formed by alternately stacking the first insulation film 12, which generates tensile stress, and the second insulation film 13, which generates compressive stress. At this time, the first insulation film 12 and the second insulation film 13 are formed so that the passivation film 11 as a whole generates tensile stress. Therefore, in consideration of the magnitude of the tensile stress of the first insulation film 12 and the magnitude of the compressive stress of the second insulation film 13, for example, the thickness of the first insulation film 12 is larger than the thickness of the second insulation film 13.

A method of enabling the passivation film 11 as a whole to generate tensile stress is not limited to the method of adjusting the thickness of the first insulation film 12 and the thickness of the second insulation film 13. The magnitude of the tensile stress of the first insulation film 12 and the magnitude of the compressive stress of the second insulation film 13 may be appropriately adjusted based on, for example, film forming conditions. The number of first insulation films 12 may be made larger than the number of second insulation films 13.

It is not necessary that the first insulation film 12 and the second insulation film 13 are made of the same material. The first insulation film 12 and the second insulation film 13 may be made of different materials. In consideration of moisture resistance and stability, preferably, each of the first insulation film 12 and the second insulation film 13 is one of a silicon nitride (such as $Si_3N_4$ or SiN) film, a silicon oxide (such as $SiO_2$ or SiO) film, and a silicon oxynitride (such as SiON) film.

Referring to FIGS. 1 to 4, a method for manufacturing the semiconductor device 1 will be described. In a general manufacturing method, a plurality of semiconductor devices 1 are simultaneously made in a single wafer. Then, in the final step (separation step) after the passivation film 11 has been formed, individual semiconductor chips are separated from the wafer. Thus, the semiconductor device 1 illustrated in FIGS. 1 and 2 is formed. The separation step of separating the semiconductor chips from a wafer will not be described here.

First, an unprocessed semiconductor substrate 21 made of a compound semiconductor, such as gallium arsenide, is prepared. Next, in a semiconductor layer forming step illustrated in FIG. 3, a semiconductor layer 21B is formed on a surface 21A of the semiconductor substrate 21 by using a film forming method such as plasma CVD. Thus, the semiconductor substrate 2 is formed.

Figure 4:
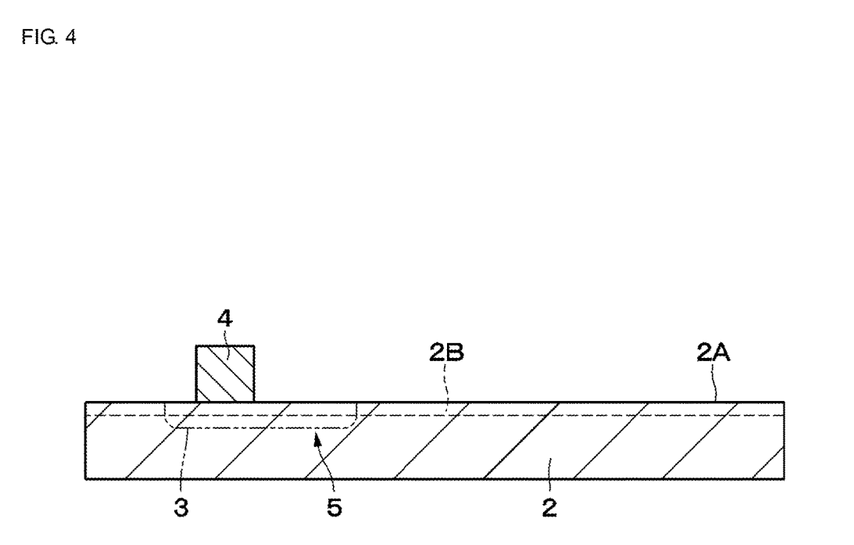
FIG. 4 is a sectional view illustrating a metal layer forming step.

Next, in a metal layer forming step illustrated in FIG. 4, a metal film of an electrically conductive metal material is formed on the surface 2A of the semiconductor substrate 2 by using a film forming method such as vacuum deposition, sputtering, or plating. Subsequently, unnecessary parts of the metal film are removed by etching or the like. Thus, the metal layer 4, which functions as electrodes, connection wiring, and the like, is formed on the surface 2A of the semiconductor substrate 2. As the metal layer 4 is formed, the semiconductor element 3 and the circuit 5 are formed in or on the semiconductor substrate 2.

Next, in a passivation film forming step, the passivation film 11, which includes the first insulation film 12 and the second insulation film 13, is formed on the surface 2A of the semiconductor substrate 2 by using a film forming method such as plasma CVD. In this step, the first insulation film 12, which generates tensile stress, and the second insulation film 13, which generates compressive stress, are formed so as to be alternately stacked.

To be specific, first, the first insulation film 12, which is the first layer (the lowest layer) and which generates tensile stress, is formed on a junction surface of the semiconductor substrate 2. Next, the second insulation film 13, which is the second layer, is formed so as to cover the first insulation film 12, which is the first layer. Next, the first insulation film 12, which is the third layer, is formed so as to cover the second insulation film 13, which is the second layer. Lastly, the second insulation film 13, which is the fourth layer, is formed so as to cover the first insulation film 12, which is the third layer.

In this step, the first insulation film 12 and the second insulation film 13 are formed under different film forming conditions, such as high frequency electric power. Thus, the tensile stress of the first insulation film 12 is larger than that of the second insulation film 13. In addition, by appropriately adjusting the magnitude of the internal stress, the thickness, and the like of the first insulation film 12 and the second insulation film 13, the passivation film 11 as a whole generates tensile stress.

The metal layer 4 is formed on the surface 2A of the semiconductor substrate 2. When forming the metal layer 4, temperature changes due to heating, cooling, or the like. The thermal expansion coefficients of the metal layer 4 and the like and the semiconductor substrate 2 differ from each other. Therefore, internal stress is generated in a portion of the semiconductor substrate 2 near the surface 2A due to the difference in the thermal expansion coefficient. Moreover, internal stress tends to be generated also in the semiconductor layer 2B of the semiconductor substrate 2. Thus, compressive stress tends to be generated in the semiconductor substrate 2 due to the manufacturing process history. In addition, the metal layer 4 has a quadrangular cross section. Therefore, stress tends to concentrate in the corner portions of the metal layer 4, and deformation or strain tends to occur in a portion of the passivation film 11 that is in contact with the metal layer 4.

However, the passivation film 11 as a whole generates tensile stress. Therefore, even when compressive stress due to the process history is generated in the semiconductor substrate 2, the passivation film 11 generating tensile stress can alleviate the compressive stress of the semiconductor substrate 2. As a result, the warping of a wafer including the semiconductor substrate 2 and generation of a crack in the passivation film 11 can be reduced.

In order to alleviate the compressive stress of the semiconductor substrate 2, preferably, the first insulation film 12, which has larger tensile stress, is disposed in a joint portion (lowest layer) between the semiconductor substrate 2 and the passivation film 11. However, the first insulation film 12, having larger tensile stress, tends to have lower density and lower moisture resistance than the second insulation film 13, having smaller tensile stress. In consideration of these, preferably, the second insulation film 13, which has smaller tensile stress and generates compressive stress, is disposed in the joint portion (lowest layer) between the semiconductor substrate 2 and the passivation film 11. In consideration of the advantages/disadvantages described above, one of the first insulation film 12 and the second insulation film 13 is appropriately selected and disposed in the joint portion between the semiconductor substrate 2 and the passivation film 11 in accordance with, for example, specifications and production yield that are required for the semiconductor substrate 2.

Thus, with the first embodiment, the passivation film 11 is formed by alternately stacking the first insulation film 12, which has larger tensile stress, and the second insulation film 13, which has smaller tensile stress; and the passivation film 11 as a whole generates tensile stress. Therefore, even when compressive stress due to the process history is generated in the semiconductor substrate 2, the passivation film 11 generating tensile stress can alleviate the compressive stress of the semiconductor substrate 2. As a result, the warping of a wafer including the semiconductor substrate 2 and generation of a crack in the passivation film 11 can be reduced.

The second insulation film 13 generates compressive stress. Therefore, the tensile stress of the second insulation film 13 is smaller than the tensile stress of the first insulation film 12. Therefore, by appropriately adjusting the stress tendency, the thickness, and the like of each of the first insulation film 12 and the second insulation film 13, the passivation film 11 as a whole can generate tensile stress. Moreover, it is possible to use an insulation film having a higher density than the first insulation film 12 as the second insulation film 13, which generates compressive stress. Therefore, the moisture resistance of the second insulation film 13 can be increased.

Moreover, each of the first insulation film 12 and the second insulation film 13 is one of a silicon nitride film, a silicon oxide film, and a silicon oxynitride film. Since the passivation film 11 is formed by stacking the first insulation film 12 and the second insulation film 13, the passivation film 11 can have insulating property and moisture resistance.

Since the metal layer 4 is made by vapor deposition or plating, compressive stress tends to be generated in the metal layer 4 while the metal layer 4 is being formed. Moreover, stress tends to concentrate in the corner portions of the metal layer 4, which has a quadrangular cross-sectional shape. However, since the passivation film 11 is formed so as to cover the metal layer 4, the passivation film 11 generating tensile stress can alleviate the compressive stress of the metal layer 4. In addition, deformation of the passivation film 11 is suppressed, and generation of a crack in the passivation film 11 can be reduced.

Figure 5:
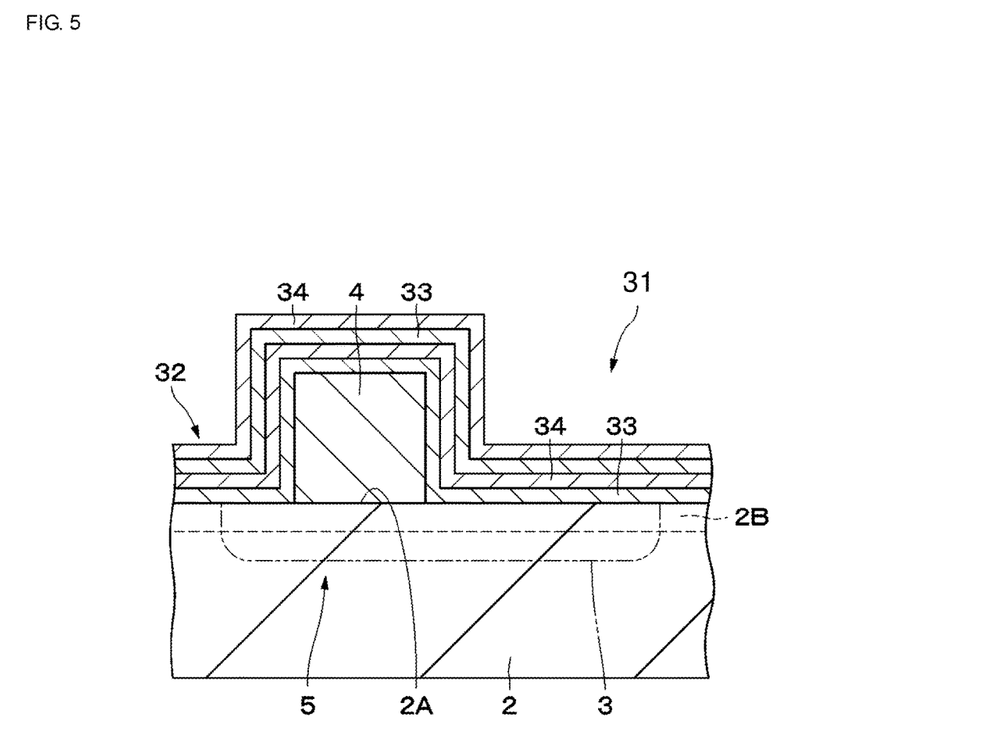
FIG. 5 is a partial enlarged sectional view of a semiconductor device according to a second embodiment.

FIG. 5 illustrates a semiconductor device 31 according to a second embodiment of the present disclosure. The semiconductor device 31 is characterized in that a passivation film 32 is formed by alternately stacking two types of tensile stress films. In the following description, elements of the semiconductor device 31 that are the same as those of the semiconductor device 1 according to the first embodiment will be denoted by the same numerals and descriptions of such elements will be omitted.

The semiconductor device 31 includes a semiconductor substrate 2, a metal layer 4, and the passivation film 32. The semiconductor device 31 according to the second embodiment is manufactured by using substantially the same manufacturing process as that for manufacturing the semiconductor device 1 according to the first embodiment.

The passivation film 32 is disposed on or over a surface 2A of the semiconductor substrate 2 so as to cover the metal layer 4. The passivation film 32 is formed by alternately stacking a first insulation film 33 and a second insulation film 34. Each of the first insulation film 33 and the second insulation film 34 is, for example, a silicon nitride film.

The film forming conditions and the like are appropriately set so that each of the first insulation film 33 and the second insulation film 34 generates tensile stress. Therefore, each of the first insulation film 33 and the second insulation film 34 is a tensile stress film that generates tensile stress.

The first insulation film 33 and the second insulation film 34 are formed under different film forming conditions (growth conditions). To be specific, the second insulation film 34 is formed by using a larger amount of high frequency electric power than the first insulation film 33. Therefore, the passivation film 32 is formed by alternately stacking the first insulation film 33, which has larger tensile stress, and the second insulation film 34, which has smaller tensile stress; and the passivation film 32 as a whole generates tensile stress.

The passivation film 32 may consist of two insulation films, which are one first insulation film 33 and one second insulation film 34 that are stacked, or three or more insulation films. That is, the number of first insulation films 33 and the number of second insulation films 34 may be the same as or different from each other. FIG. 5 illustrates an example in which the passivation film 32 includes two first insulation films 33 and two second insulation films 34.

It is not necessary that the first insulation film 33 and the second insulation film 34 are made of the same material. The first insulation film 33 and the second insulation film 34 may be made of different materials. In consideration of moisture resistance and stability, preferably, each of the first insulation film 33 and the second insulation film 34 is one of a silicon nitride film, a silicon oxide film, and a silicon oxynitride film.

In order to alleviate the compressive stress of the semiconductor substrate 2, preferably, the first insulation film 33, which has larger tensile stress, is disposed in a joint portion (lowest layer) between the semiconductor substrate 2 and the passivation film 32. However, the first insulation film 33, having larger tensile stress, tends to have lower density and lower moisture resistance than the second insulation film 34, having smaller tensile stress. In consideration of these, preferably, the second insulation film 34, which has smaller tensile stress, is disposed in the joint portion (lowest layer) between the semiconductor substrate 2 and the passivation film 32.

Thus, the second embodiment has substantially the same advantageous effects as the first embodiment. In the second embodiment, the passivation film 32 is formed by alternately stacking two types of tensile stress films, which are the first insulation film 33 and the second insulation film 34. Therefore, the passivation film 32 as a whole generates tensile stress. Accordingly, even when compressive stress due to the process history is generated in the semiconductor substrate 2, the passivation film 32 generating tensile stress can alleviate the compressive stress of the semiconductor substrate 2.

Figure 6:
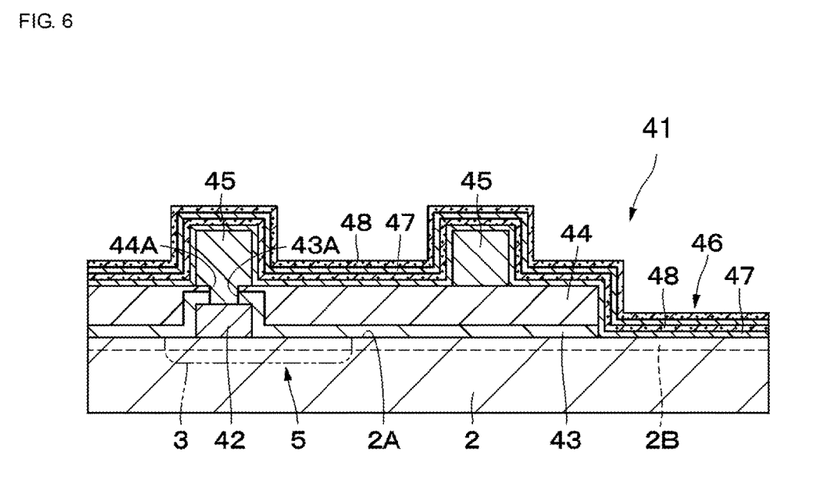
FIG. 6 is a sectional view of a semiconductor device according to a third embodiment.
Figure 7:
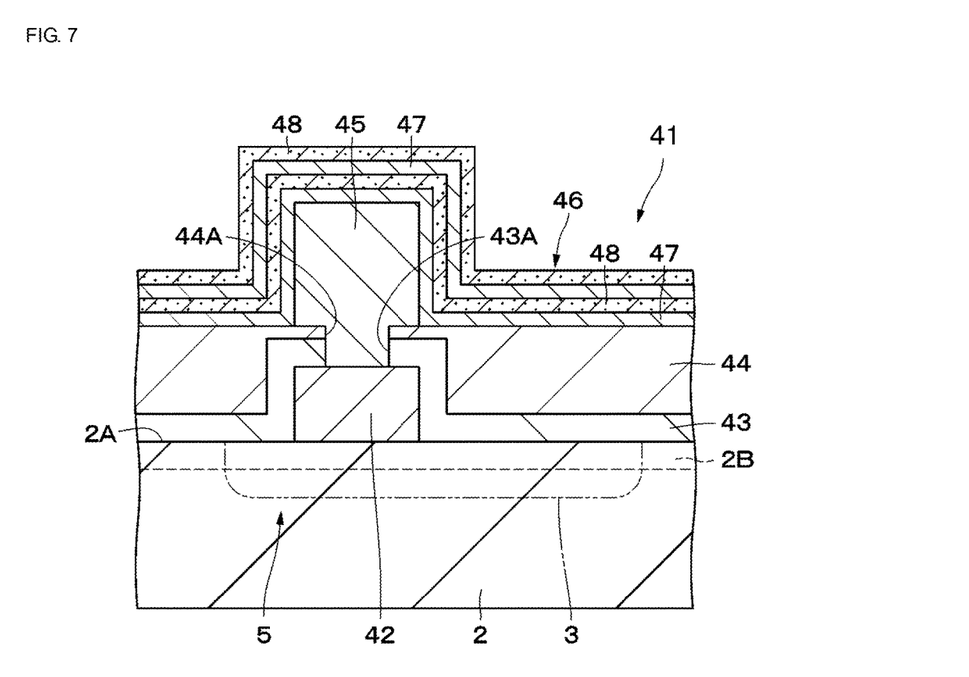
FIG. 7 is a partial enlarged sectional view of the semiconductor device according to the third embodiment.

FIGS. 6 and 7 illustrate a semiconductor device 41 according to a third embodiment of the present disclosure. The semiconductor device 41 is characterized in that a first metal layer 42, an insulation layer 43, an organic layer 44, and a second metal layer 45 are formed on or over a surface 2A of a semiconductor substrate 2; and a passivation film 46 is formed so as to cover these layers. In the following description, elements of the semiconductor device 41 that are the same as those of the semiconductor device 1 according to the first embodiment will be denoted by the same numerals and descriptions of such elements will be omitted.

The semiconductor device 41 includes the semiconductor substrate 2, the first metal layer 42, the insulation layer 43, the organic layer 44, the second metal layer 45, and the passivation film 46. A semiconductor layer 2B is formed on the surface 2A of the semiconductor substrate 2.

The first metal layer 42, which is a metal layer adjacent to the semiconductor substrate 2, is formed on the surface 2A of the semiconductor substrate 2. The first metal layer 42 is made of, for example, an electrically conductive metal material. The first metal layer 42 has various functions, such as a function of forming electrodes of a semiconductor element 3 and a function of electrically connecting a plurality of semiconductor elements 3 to each other. As a result, a circuit 5, including the semiconductor element 3, is formed in or on the semiconductor substrate 2.

The insulation layer 43 is formed on the surface 2A of the semiconductor substrate 2 so as to cover the semiconductor element 3. The insulation layer 43 is made of an insulating inorganic material, such as silicon nitride. A via 43A which is a through-hole is formed in the insulation layer 43, for example, at a position corresponding to the position of the first metal layer 42. The insulation layer 43 is an interlayer insulating layer that electrically insulates the surface 2A of the semiconductor substrate 2 and the second metal layer 45 from each other.

The organic layer 44 is formed over the semiconductor substrate 2 so as to cover the insulation layer 43. The organic layer 44 is an interlayer insulating layer as with the insulation layer 43. The organic layer 44 is made of an insulating organic material, such as polyimide resin (PI), benzocyclobutene (BCB), polybenzoxazole (PBO), or the like. The organic layer 44 tends to have a larger thickness than the insulation layer 43. The organic layer 44 has a function of, for example, flattening the entirety of the surface of the semiconductor device 41 and a function of reducing the interlayer capacitance between the first metal layer 42 and the second metal layer 45. A via 44A which is a through-hole is formed in the organic layer 44 at a position corresponding to the position of the first metal layer 42. The via 44A is disposed at a position corresponding to the position of the via 43A. Therefore, the surface of the first metal layer 42 is exposed in the via 44A. It is not necessary that the vias 43A and 44A have the same size (same opening area). The sizes of the vias 43A and 44A may differ from each other. For example, the via 44A of the organic layer 44 may be larger than the via 43A of the insulation layer 43.

The second metal layer 45 is a metal layer that is not in contact with the semiconductor substrate 2. The second metal layer 45 is located on the surface of the organic layer 44 and formed over the semiconductor substrate 2. The second metal layer 45 is made of, for example, an electrically conductive metal material. The second metal layer 45 have various functions, such as a function of electrically connecting the semiconductor element 3 to the outside with the first metal layer 42 therebetween. Therefore, the second metal layer 45 is electrically connected to the first metal layer 42 through the vias 43A and 44A.

The passivation film 46 is disposed on or over the semiconductor substrate 2 so as to cover the second metal layer 45. Therefore, the passivation film 46 covers not only the second metal layer 45 but also the organic layer 44, the semiconductor layer 2B, and the like. The passivation film 46 is structured in substantially the same way as the passivation film 11 according to the first embodiment. Therefore, the passivation film 46 is formed by alternately stacking a first insulation film 47 that has larger tensile stress and a second insulation film 48 that has smaller tensile stress; and the passivation film 46 as a whole generates tensile stress. The first insulation film 47 is structured in substantially the same way as the first insulation film 12 according to the first embodiment. Therefore, the first insulation film 47 is a tensile stress film. The second insulation film 48 is structured in substantially the same way as the second insulation film 13 according to the first embodiment. Therefore, the second insulation film 48 is a compressive stress film.

Referring to FIGS. 6 to 13, a method for manufacturing the semiconductor device 41 will be described. In a general manufacturing method, in the final step (separation step) after the passivation film 46 has been formed, individual semiconductor chips are separated from a wafer. Thus, the semiconductor device 41 illustrated in FIGS. 6 and 7 is formed. The separation step of separating semiconductor chips from a wafer will not be described here.

First, an unprocessed semiconductor substrate made of a compound semiconductor, such as gallium arsenide, is prepared. Next, a semiconductor layer is formed on the surface of the semiconductor substrate by using a film forming method such as plasma CVD. Thus, the semiconductor substrate 2 is formed. These steps are substantially the same as the semiconductor film forming steps according the first embodiment shown in FIG. 3.

Figure 8:
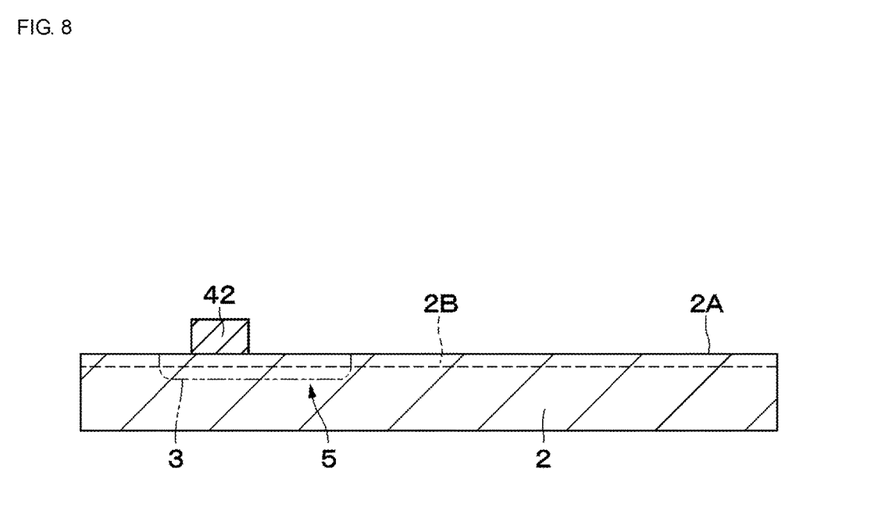
FIG. 8 is a sectional view illustrating a first metal layer forming step.

Next, in a first metal layer forming step illustrated in FIG. 8, a metal film of an electrically conductive metal material is formed on the surface 2A of the semiconductor substrate 2 by using a film forming method such as vacuum deposition, sputtering, or plating. Subsequently, unnecessary parts of the metal film are removed by etching or the like. Thus, the first metal layer 42, which functions as electrodes, connection wiring, and the like, is formed on the surface 2A of the semiconductor substrate 2. Accordingly, the semiconductor element 3 and the circuit 5 are formed in or on the semiconductor substrate 2.

Figure 9:
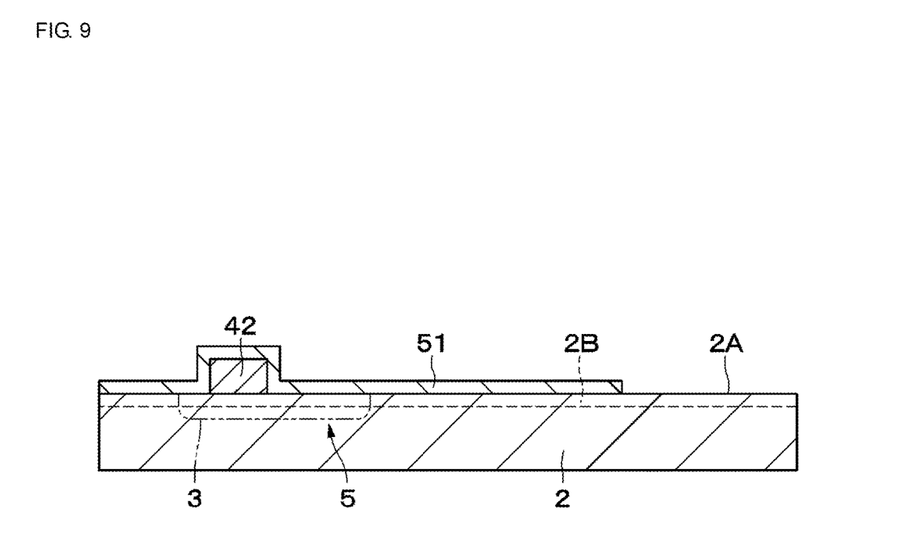
FIG. 9 is a sectional view illustrating an insulation layer forming step.

Next, in an insulation layer forming step illustrated in FIG. 9, an insulation film 51 of an insulating inorganic material film, such as silicon nitride, is formed on the surface 2A of the semiconductor substrate 2 by using a film forming method such as plasma CVD. In this step, the insulation film 51 is formed so as to cover the entirety of the surface 2A of the semiconductor substrate 2.

Figure 10:
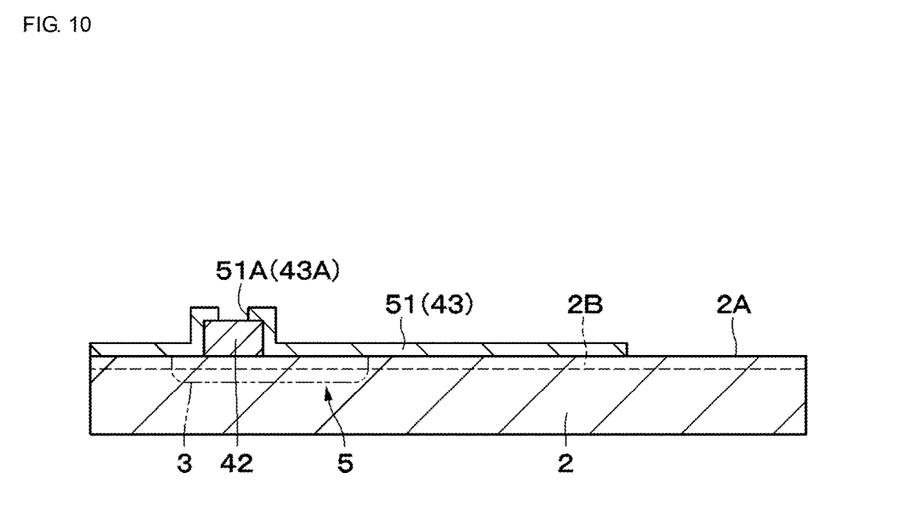
FIG. 10 is a sectional view illustrating a first via forming step.

Next, in a first via forming step illustrated in FIG. 10, etching is performed in a state in which, for example, necessary parts are masked by using photoresist or the like, and thereby a via 51A, which is a though-hole, is formed in the insulation film 51. Thus, the insulation layer 43 having the via 43A is formed on the semiconductor substrate 2.

Figure 11:
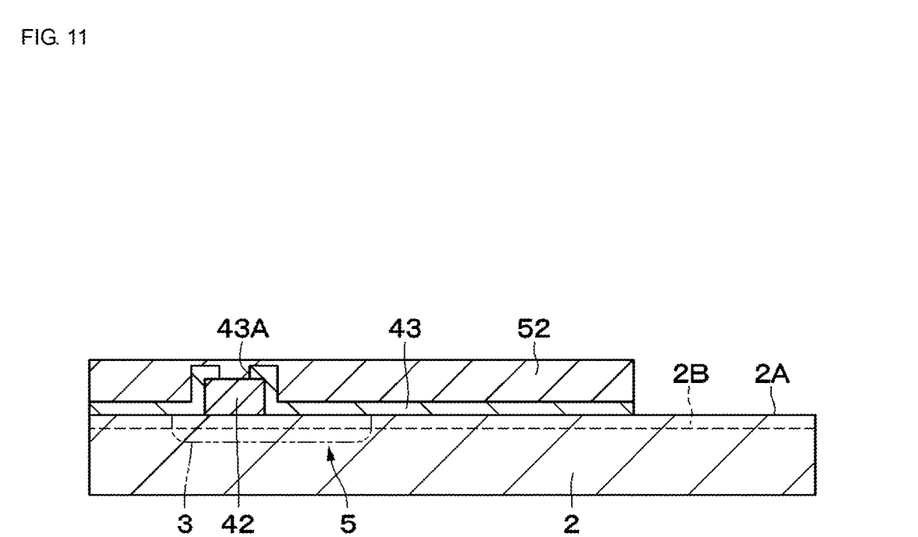
FIG. 11 is a sectional view illustrating an organic layer forming step.

Next, in an organic layer forming step illustrated in FIG. 11, an organic layer 52, which is made of a polyimide resin or the like, is formed on the surface of the insulation layer 43 by applying an appropriate resin material to the surface by spin coating.

Figure 12:
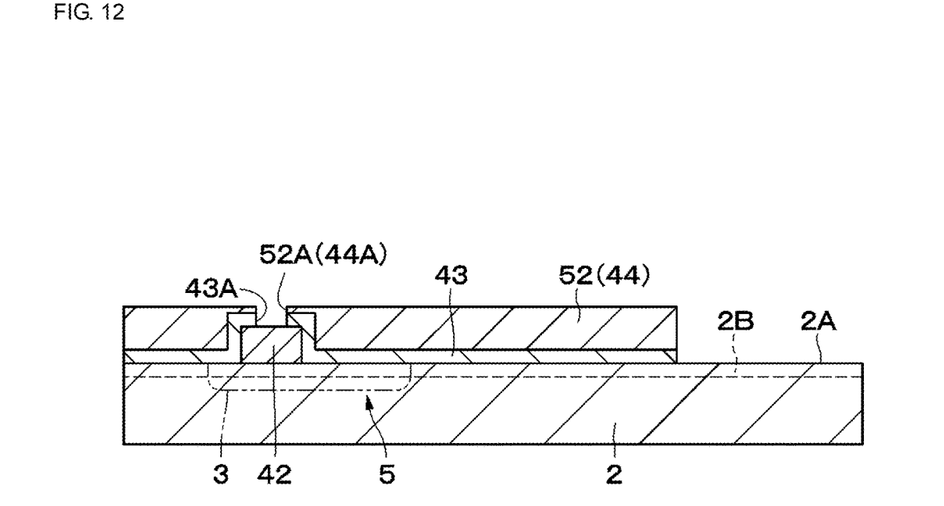
FIG. 12 is a sectional view illustrating a second via forming step.

Subsequently, in a second via forming step illustrated in FIG. 12, for example, holes are formed in the organic layer 52 by using a microfabrication technology, such as a technology using a photoresist. Thus, a via 52A is formed in the organic layer 52 at a position corresponding to the position of the via 43A of the insulation layer 43. As a result, the organic layer 44 is formed over the semiconductor substrate 2 so as to cover the insulation layer 43. The organic layer 44 may be formed by using a photosensitive resin material. In this case, it is possible to form the via 44A in the organic layer 44 by irradiating the photosensitive resin material with ultraviolet rays or the like.

Figure 13:
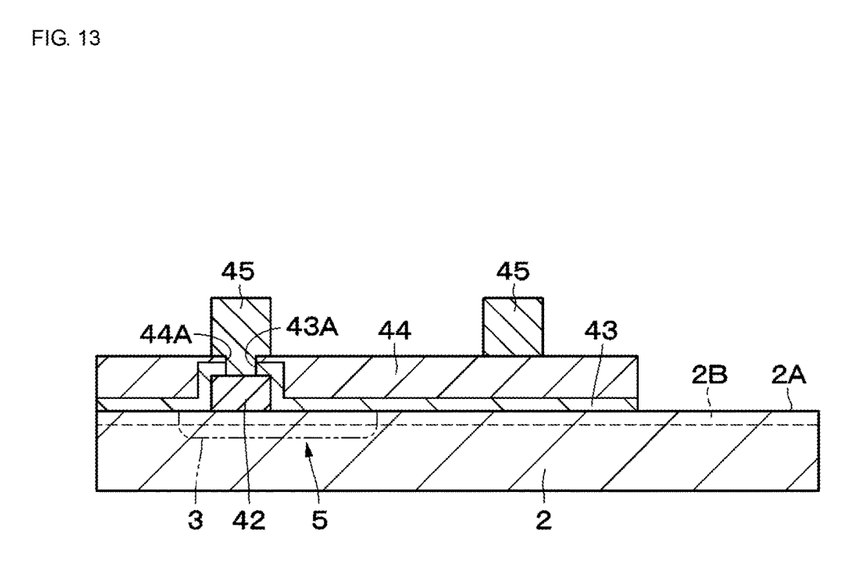
FIG. 13 is a sectional view illustrating a second metal layer forming step.

Next, in a second metal layer forming step illustrated FIG. 13, a metal film of an electrically conductive metal material is formed on the surface of the organic layer 44 by using a film forming method such as vacuum deposition, sputtering, or plating. Subsequently, unnecessary parts of the metal film are removed from the metal film by etching or the like. Thus, the second metal layer 45, which functions as external connection wiring and the like, is formed on the surface of the organic layer 44.

Next, in a passivation film forming step, the passivation film 46, which includes the first insulation film 47 and the second insulation film 48, is formed on or over the surface 2A of the semiconductor substrate 2 by using a film forming method such as plasma CVD. The passivation film 46 is formed on or over the surface 2A of the semiconductor substrate 2 so as to cover the organic layer 44, the second metal layer 45, and the like. In this step, the first insulation film 47, which generates tensile stress, and the second insulation film 48, which generates compressive stress, are formed so as to be alternately stacked. The details of the passivation film forming step are substantially the same as those of the passivation film forming step according to the first embodiment. Through the process described above, the semiconductor device 41 illustrated in FIGS. 6 and 7 is formed.

Thus, the third embodiment has substantially the same advantageous effects as the first embodiment. In the third embodiment, the passivation film 46 is formed on or over the semiconductor substrate 2 so as to cover the semiconductor layer 2B, the first metal layer 42, the insulation layer 43, the organic layer 44, and the second metal layer 45. Therefore, even when the semiconductor layer 2B, the insulation layer 43, the organic layer 44, and the metal layers 42 and 45 generate compressive stresses due to the differences in the thermal expansion coefficient therebetween, the passivation film 46 generating tensile stress can alleviate these compressive stresses.

The metal layers 42 and 45 are formed by vapor deposition or plating. Therefore, compressive stresses tend to be generated in the metal layers 42 and 45 while the metal layers 42 and 45 are being formed. However, since the passivation film 46 is formed so as to cover the metal layers 42 and 45, the passivation film 46 generating tensile stress can alleviate these compressive stresses of the metal layers 42 and 45.

The passivation film 11 according to the first embodiment is used as the passivation film 46 according to the third embodiment. However, the present disclosure is not limited to this usage. The passivation film 32 according to the second embodiment may be used as a passivation film according to the third embodiment.

In the embodiments described above, the semiconductor devices 1, 31, and 41 are used, for example, as electric power amplifiers. However, the present disclosure is not limited to this usage. A semiconductor device according to an embodiment of the present disclosure may be used as a passive element such as a solar cell, a light-emitting element such as a laser diode (LD) or a light emitting diode (LED), or an optical sensor including both of a light-receiving element and a light-emitting element.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a semiconductor substrate;
   a semiconductor element provided in or on the semiconductor substrate; and
   a passivation film protecting the semiconductor element,
   wherein the passivation film comprising one or more first insulation films and one or more second insulation films, the first insulation films and second insulation films are alternately stacked to each other, each of the first insulation films has larger tensile stress and each of the second insulation films has smaller tensile stress, and the passivation film as a whole generates tensile stress,
   the semiconductor device further comprising a semiconductor layer, an insulation layer, an organic layer, and a metal layer provided on or over the semiconductor substrate, and
   wherein the passivation film covers the semiconductor layer, the insulation layer, the organic layer, and the metal layer.

2. The semiconductor device according to claim 1,
   wherein each of the second insulation films generates compressive stress.

3. The semiconductor device according to claim 1,
   wherein each of the first insulation films and the second insulation films is one of a silicon nitride film, a silicon oxide film, and a silicon oxynitride film.

4. The semiconductor device according to claim 2,
   wherein each of the first insulation films and the second insulation films is one of a silicon nitride film, a silicon oxide film, and a silicon oxynitride film.

5. A method of manufacturing a semiconductor device, the method comprising:
   a step of forming a passivation film on or over a semiconductor substrate by alternately stacking one or more first insulation films and one or more second insulation films, each of the first insulation films has larger tensile stress and each of the second insulation films has smaller tensile stress so that the passivation film as a whole generates tensile stress,
   the method further comprising:
   a step of forming a semiconductor layer, an insulation layer, an organic layer, and a metal layer on or over the semiconductor substrate, the step being performed before the step of forming the passivation film,
   wherein, in the step of forming the passivation film, the passivation film covers the semiconductor layer, the insulation layer, the organic layer, and the metal layer.

6. The method according to claim 5,
   wherein the metal layer is formed by vapor deposition or plating.

* * * * *